United States Patent
Horzel et al.

(10) Patent No.: US 9,385,263 B2
(45) Date of Patent: Jul. 5, 2016

(54) METHOD FOR PRODUCING A DOPANT PROFILE

(75) Inventors: Joerg Horzel, Heverlee (BE); Dieter Franke, Bl Vaals (NL); Gabriele Blendin, Linsengericht (DE); Marco Faber, Mainz (DE); Wilfried Schmidt, Schwaigern (DE)

(73) Assignee: SCHOTT SOLAR AG, Mainz (DE)

( * ) Notice: Subject to any disclaimer, the term of this patent is extended or adjusted under 35 U.S.C. 154(b) by 1101 days.

(21) Appl. No.: 13/139,218

(22) PCT Filed: Dec. 3, 2009

(86) PCT No.: PCT/EP2009/066291
§ 371 (c)(1),
(2), (4) Date: Aug. 1, 2011

(87) PCT Pub. No.: WO2010/066626
PCT Pub. Date: Jun. 17, 2010

(65) Prior Publication Data
US 2011/0278702 A1    Nov. 17, 2011

(30) Foreign Application Priority Data
Dec. 12, 2008   (DE) .......................... 10 2008 055 515

(51) Int. Cl.
*H01L 31/0224*    (2006.01)
*H01L 31/0232*    (2014.01)
(Continued)

(52) U.S. Cl.
CPC ........ *H01L 31/1804* (2013.01); *H01L 21/2253* (2013.01); *H01L 21/2255* (2013.01); *H01L 31/035281* (2013.01); *H01L 31/068* (2013.01); *Y02E 10/547* (2013.01); *Y02P 70/521* (2015.11)

(58) Field of Classification Search
CPC .................. H01L 31/0216; H01L 31/022425; H01L 31/02365; H01L 31/1864; H01L 21/02164; H01L 21/02238; H01L 21/2225; H01L 21/2251; H01L 21/2255; H01L 21/2257; H01L 21/228; H01L 21/26513
See application file for complete search history.

(56) References Cited

U.S. PATENT DOCUMENTS

| 3,183,130 A | 5/1965 | Reynolds et al. |
| 3,956,036 A | 5/1976 | Molee |

(Continued)

FOREIGN PATENT DOCUMENTS

| CN | 1516891 A | 7/2004 |
| DE | 19908400 | 9/2000 |

(Continued)

OTHER PUBLICATIONS

International Search Report dated Nov. 3, 2010 corresponding to International Patent Application No. PCT/EP09/66291.

(Continued)

*Primary Examiner* — Pamela E Perkins
(74) *Attorney, Agent, or Firm* — Ohlandt, Greeley, Ruggiero & Perle, LLP

(57) ABSTRACT

A method for producing a dopant profile is provided. The method includes starting from a surface of a wafer-shaped semiconductor component by introducing dopant atoms into the semiconductor component. The dopant-containing layer is produced on or in a region of the surface in order to produce a provisional first dopant profile and then a plurality of semiconductor components having a corresponding layer is subjected to heat treatment on top of one another in the form of a stack in order to produce a second dopant profile having a greater depth in comparison to the first dopant profile.

19 Claims, 2 Drawing Sheets

Figure 1:
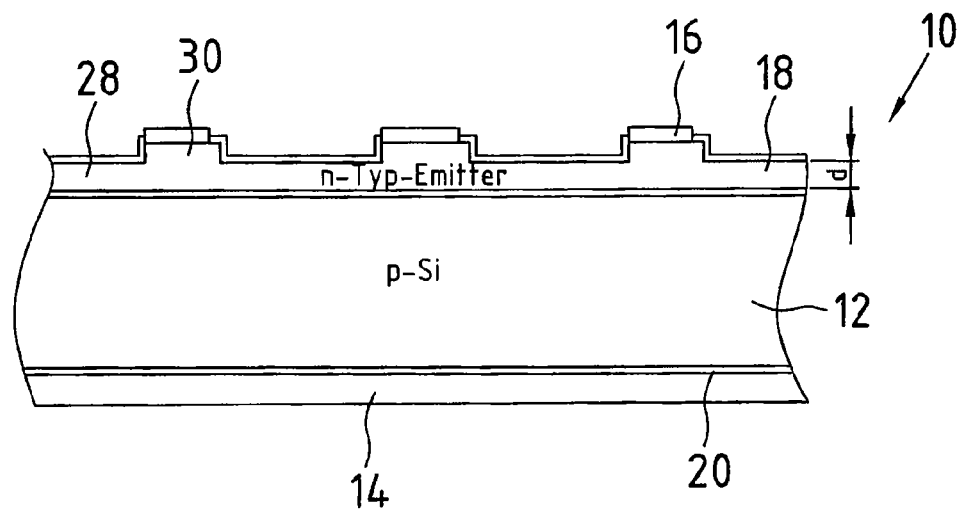

(51) Int. Cl.
  *H01L 31/18* (2006.01)
  *H01L 21/225* (2006.01)
  *H01L 31/0352* (2006.01)
  *H01L 31/068* (2012.01)

(56) References Cited

U.S. PATENT DOCUMENTS

| | | | |
|---|---|---|---|
| 4,029,518 A | 6/1977 | Matsutani | |
| 4,104,091 A | 8/1978 | Evans, Jr. et al. | |
| 4,676,845 A | 6/1987 | Spitzer | |
| 6,117,266 A | 9/2000 | Horzel | |
| 6,180,869 B1* | 1/2001 | Meier et al. | 136/256 |
| 6,613,974 B2* | 9/2003 | Husher | 136/255 |
| 6,806,173 B1 | 10/2004 | Spitz | |
| 2007/0215596 A1 | 9/2007 | Wintenberger et al. | |
| 2010/0037946 A1* | 2/2010 | Yatabe et al. | 136/256 |
| 2010/0075485 A1* | 3/2010 | Rana et al. | 438/482 |
| 2013/0167904 A1* | 7/2013 | Moslehi | H01L 31/0352 136/246 |
| 2013/0203212 A1* | 8/2013 | Wang | 438/98 |

FOREIGN PATENT DOCUMENTS

| | | |
|---|---|---|
| EP | 0874387 | 10/1998 |
| EP | 0874387 A1 | 10/1998 |
| JP | 49141870 U | 12/1974 |
| JP | 49141870 | 5/1976 |
| JP | 2007053353 | 3/2007 |
| JP | 200821824 A | 1/2008 |

OTHER PUBLICATIONS

Szlufcik, J. et al., "Low-Cost Industrial Technologies of Crystalline Silicon Solar Cells;" Proceedings of the IEEE, vol. 85, No. 5, May 1997, pp. 711-730.

M. Rinio et al., "Defect Redistribution by Low Temperature Annealing in Ingot Silicon Solar Cells," Proc. 23rd EPVSEC, Valencia, Spain, Sep. 2008, p. 1014.

T. Buonassisi et al., "Reducing the Concentration of Interstitial Iron in Crystalline Silicon Solar Cells via Low . . . ," NREL Workshop on Crystalline Si Solar Cell and Modules, 2007.

B. Sopori, NREL/CP-520-27524, "Impurities and Defects in Photovoltaic Si Devices: A Review," Dehli, India, Nov. 1999.

K. Hartman et al., "Dislocation density reduction in multicrystalline silicon solar cell material by high temperature annealing," Appl. Phys. Lett. 93, 122108, 2008.

Gunnar Schubert, Ph.D. Thesis, "Thick Film Metallization of Crystalline Silicon Solar Cells Mechanisms, Models, Applications," University of Konstanz, 2006.

English translation of Japanese Office Action dated Sep. 3, 2013 corresponding to Japanese Patent App. 2011-540024, 21 pp.

English translation of Chinese Office Action dated Jul. 19, 2013 corresponding to Chinese Patent App. 200980156590.4, 11 pp.

* cited by examiner

METHOD FOR PRODUCING A DOPANT PROFILE

The invention relates to a method for producing a dopant profile starting from a surface of a chip- or wafer-shaped semiconductor component by implanting dopant atoms in a thermal process. The invention also relates to a semiconductor component, such as, for example, semiconductor components for transforming electromagnetic radiation or light into electrical energy. The subject of the invention is also a method for manufacturing a flat chip- or wafer-shaped semiconductor component having a dopant profile starting from at least one surface.

It has long been known that semiconducting materials may be used to absorb photons—for example, those from the spectrum of sunlight arriving at the Earth's surface—in semiconductor materials—such as, for example, silicon—and thereby to produce charge-carrier pairs, which, in the presence of a semiconductor transition—whether it be differently doped semiconductor regions or whether it be different contiguous semiconductor materials—can create a voltage between the differently doped semiconductor regions or semiconductor materials. If metal contacts of appropriate shape are joined to the different semiconductor regions, an external electrical circuit can be connected to these contacts and, in the presence of a sufficient flow of photons toward the semiconductor component, a continuous flow of current can be maintained through the external electrical circuit.

Crucial factors for the industrial fabrication of such semiconductor components that transform light into electric current are the efficiency of transformation of light energy into electrical energy and the manufacturing costs associated with the processing of the semiconductor components.

The use of semiconductor chips made of silicon and having dimensions of, for example, 100-300 mm in the x and y direction and a thickness of preferably between 50 µm and 500 µm as starting material for manufacture is known. These semiconductor chips—also referred to as wafers—are usually doped largely homogeneously with a dopant for silicon. In order to produce a semiconductor transition, a second dopant is placed on portions of the semiconductor chip surfaces or onto all semiconductor chip surfaces or else transported onto these surfaces. Coming into consideration for this process are diverse chemical substances, chemical and thermal methods, as well as sputtering and ion implantation methods in order to bring the dopant to the semiconductor chip surface and to have it penetrate from there into the semiconductor.

The dopant is usually implanted in the silicon from a dopant source in a single thermal process step. In doing so, it is crucial in the manufacture of semiconductor components that are suitable for transforming photon energy into electrical energy that a large number of components per unit of time can be manufactured in order to keep the process costs per component low. Furthermore, the process for implanting dopants is usually to be chosen so that the volume of the semiconductor component is not heated above a certain limiting temperature, because, particularly for silicon materials that are not single crystalline and for silicon materials that contain impurities and crystal lattice defects, high process temperatures result in shortened lifetimes for mobile minority charge carriers produced by photons being trapped at active defect sites in the silicon due to the heat treatment and being recombined at these sites to the initial energy state—without contributing to the production of electrical energy.

The limiting temperatures during thermal treatment, above which the recombination probability increases markedly, are typically in the range of between 950° C. and 1100° C. for single-crystalline silicon components and above 900° C.-950° C. for non-single-crystalline silicon components. The controlled thermal implantation of dopants is further governed by the process time, the dopant concentration in the dopant source, and the atmosphere in the reaction chamber in which the process is being carried out.

For economic reasons in the case of typical industrially fabricated semiconductor components suitable for energy transformation of photons into electrical energy, a dopant profile is produced, starting from the surface being supplied with the dopant and dropping off into the silicon interior, by using a single heat-treatment step, which can last, for example, more than 5 min and up to 60 min. Conventional in this case are penetration depths for the dopant of up to a depth of 0.5 µm below the surface. The dopant concentration greatly decreases in this region, until the dopant concentration is less than the dopant concentration of the starting silicon material.

During the thermal treatment, dopant atoms of the dopant source have, on the one hand, a probability of penetrating into the silicon and, on the other hand, a probability of moving further by a certain distance in the silicon within a certain time due to random processes. The total penetration depth of the dopant atoms from the boundary surface between the semiconductor component and the dopant source is thus determined by the factors of time, temperature, dopant concentration in the dopant source, probability of penetration into the semiconductor component—for a corresponding atmosphere—and the mobility of the dopant atoms within the semiconductor component under the corresponding process conditions and the limitations of the dopant source.

The starting concentration in the dopant source is desirably chosen to be very high for industrially applicable processes. On the one hand, a very high surface dopant concentration in the semiconductor component has hitherto been required in order to be able to use economically reasonable manufacturing processes to manufacture conductive contacts having a low contact transition resistance to the semiconductor material. Generally, metal pastes or currentless metal deposition methods are employed for this in order to produce a contact to the semiconductor material all the way through dielectric layers. On the other hand, a high dopant concentration in the dopant source and at the semiconductor surface is required in order to enable the dopant to penetrate to a penetration depth of at least 0.2 µm to 0.3 µm into the semiconductor in only one thermal process step and in a process time that is limited for economic reasons and, in parallel to this, to produce a dopant film layer having a resistance of <100 ohm/sq. without, in doing so, having to resort to process temperatures markedly above 900° C. The minimum penetration depth is required in order to prevent impurities, such as, for example, metal atoms, from advancing into the semiconductor transition when the metal contacts are baked and thereby negatively influencing the diode properties of the semiconductor transition (no recombination and no leakage currents are desired). The layer resistance of the doped layer formed during penetration of dopant atoms should be sufficiently low so as not to lead to appreciable series resistance losses during the transport of charge carriers into these layers.

A relatively simple and economically interesting process sequence is possible in both cases, which however, requires a high surface concentration of dopants in order to permit low contact transition resistances and thereby make possible a high transformation efficiency of the semiconductor component during transformation of light into electrical energy based on small resistance losses during transport of the charge carriers.

For low starting dopant concentrations, such as <$10^{19}$ dopant atoms/cm$^3$, for example, a temperature of 1000° C. and a process time of 60 minutes for the implantation of dopant atoms is not sufficient to achieve these goals. A minimum conductivity of the doping layer and a minimum penetration depth of this doping layer are required, however, in order to ensure that, when conventional contacting methods for industrial semiconductor components of the kind described are used, the following loss mechanisms are suppressed: losses due to series resistance in the region doped by thermal treatment (transport of charge carriers toward the metal contacts), series resistance losses in the semiconductor-metal contact transition shadowing losses due to metal contacts, which are limited in terms of their minimum width and hence also in terms of their optimal separation from one another, parallel resistance or recombination losses due to impurities, which can advance into the region of the semiconductor transition due to the metallization methods employed, losses due to recombination of minority charge carriers within the formed doping layer (in particular, losses of short-wavelength portions of the electromagnetic radiation spectrum that can be transformed into electrical energy by the semiconductor component).

If it is not possible to minimize these losses sufficiently, it is fundamentally impossible to manufacture any economically advantageous and competitive semiconductor components for transforming light into electrical energy.

According to the prior art, it has not yet been possible to manufacture semiconductor components for transforming light into electrical energy and, at the same time, fulfill the following criteria: to provide production processes and production plants suitable for high throughput (on average, 1 wafer/s), to dope, starting from the surface, semiconductor chips that have largely a homogenous initial doping of the first type—n-type or p-type semiconductor—with a second dopant of opposite doping and, at the same time, to achieve deep penetration depths for dopant atoms (at these deep penetration depths, the pn transition to the second dopant of opposite polarity is located at least 0.3 µm, still better >1 µm or even deeper, below the surface), to achieve relatively low surface concentrations (<<$10^{20}$ doping atoms/cm$^3$), without, in doing so, having to go to very high process temperatures (>900° C.), to use long process times of several hours to implant dopants, without, in doing so, significantly raising the production costs in comparison to processes that are very much shorter, to use effectively dielectric layers, which, at the same time, serve for passivation of defects in the surface and for marked reduction of reflections at the surface, to effectively remove or render harmless metal impurities from or in the semiconductor component by accumulating these impurities during the high-temperature treatment for implanting dopant atoms in the semiconductor chips from the surface and, if need be, subsequently removing the accumulated metal impurities from there (for example, by etching or oxidizing very highly doped regions of the doping layer).

No economically applicable method for implanting dopant atoms that allows the manufacture of large-area semiconductor components for transforming light into electrical energy with a throughput of markedly greater than 1000 components per hour and that allows for this process times for implanting dopants of markedly greater than one hour has hitherto been known. Nor are there available any commercially usable semiconductor components for transforming light into electrical energy that have large-area diffused regions with a penetration depth of 1 µm and deeper. Also unavailable commercially at the present time are any semiconductor components for transforming light into electrical energy that use an emitter range on the light-receiving side that has a P surface concentration of markedly less than $10^{20}$ P atoms/cm$^3$ and is contacted using economical metallization methods (metal pastes).

For economic and competitive reasons, commercially available semiconductor components for transforming light into electrical energy are subject to the requirement of being manufactured at costs that make these products attractive to potential buyers in a price comparison of the costs of these products relative to their performance. At the same time, it is necessary to use methods that allow the manufacture of very high numbers of these large-area semiconductor components per unit of time in order to survive on the market.

Given these prerequisites, nearly all products available on the market make compromises at the present time, leaving unexploited the efficiency potential of said semiconductor components for transforming light into electrical energy so as to achieve cost advantages.

The great majority of the semiconductor components for transforming light into electrical energy that are currently produced worldwide are fabricated on polycrystalline Si wafers having intrinsic defects and impurities. In particular, all crystalline silicon components of this kind, having metal contacts at both surfaces (light-facing side and back side) have the following weak points: high recombination losses in the emitter region of the light-facing side lead to declines in efficiency due to insufficient yield of the sunlight spectrum in the blue region of the spectrum; high shadowing losses due to front-side contacts, which lead to appreciable declines in efficiency; series resistance losses in the emitter, in the contact transition of the metal contacts to the emitter, and in the line conductivity of the contacts, which lead to declines in efficiency; deficient passivation of surface defects, which leads to declines in efficiency, because a very high P (=phosphorus) surface concentration must be used in order to achieve acceptable contact transition resistances; insufficient process-related elimination or passivation of intrinsic impurities as well as impurities that are introduced externally in the silicon during processing, resulting in recombination losses inside the semiconductor component and to declines in efficiency associated therewith, which can have quite drastic consequences, particularly in polycrystalline silicon materials, and greatly limit the efficiency that can be achieved; the maximally achievable efficiency is even more strongly limited in thinner and thus more cost-effective semiconductor components by surface passivation since the crystalline silicon semiconductor components are made thinner; appreciable losses during the input of light in crystalline silicon semiconductor components due to deficits in the surface structures or due to elevated recombination losses in the emitter and pn transition in the case of strongly doped emitters on textured surfaces.

A solar cell is known from U.S. Pat. No. 4,029,518, the emitter of which is made up of regions of different thickness. Contacts are arranged on the regions with greater thickness.

The reference Szlufcik J. et al., "Low Cost Industrial Technologies of Crystalline Silicon Solar Cells," Proceedings of the IEEE, Vol. 85, No. 5, May 1997, pages 711-730, describes methods for the cost-effective manufacture of crystalline silicon solar cells. These can have emitters of different thicknesses, with the thicknesses in the regions in which contact fingers run being greater than in adjacent regions.

A heating arrangement for treating silicon wafers arranged in a stack is known from USA 2007/0215596. In this case, each individual wafer is positioned in a holder. The holders are arranged on top of one another and exposed to temperatures of between 300° C. and 800° C.

The present invention is based on the problem of further developing a method of the kind mentioned in the beginning so that the inherent drawbacks of the prior art are avoided. In particular, the objective is that cost-effective semiconductor components having a desired dopant depth profile can be manufactured and that, in particular when known systems are used, a high throughput can be achieved or, given comparable throughput, a longer process time for implanting dopant atoms is made possible in order to allow a deeper penetration of the dopant into the semiconductor material.

The possibility will also be created of easily contacting the surface regions having the dopant profile, without the regions that are not shadowed by the contacts having a dopant concentration that includes high concentrations of recombinant-active defect sites.

According to another aspect of the invention, it will be ensured that, during the manufacture of semiconductor components preferably having a dopant depth profile, these semiconductor components are absolutely even or flat following heat treatment.

The problem is solved in accordance with the method of the invention essentially, first of all, by producing a dopant-containing layer on or in a region of the surface and then subjecting a plurality of semiconductor components having a corresponding layer to heat treatment on top of one another in the form of a stack, in order to produce the particular dopant profile. It is especially provided that the layer is produced by formation of an oxide film layer containing the dopant atoms or by ion implantation or sputtering of dopant atoms.

Consequently, in accordance with the invention, in order to produce a provisional first dopant profile, a dopant-containing layer is produced on or in a region of the surface of the semiconductor component, and then a plurality of semiconductor components having a corresponding layer and arranged on top of one another in the form of a stack are subjected to a heat treatment step in order to implant the dopant atoms in the semiconductor. If a dopant depth profile was already produced during the formation of the doping layer on the semiconductor component, a second dopant profile having a greater depth in comparison to the first dopant profile is produced in the stack by the heat treatment.

In other words, first of all, a first dopant profile is produced in the individual semiconductor components. Then, corresponding semiconductor components, each having a first dopant profile, are placed on top of one another and stacked. A stack formed in this way is subsequently subjected as a unit to a heat treatment in order to produce in each semiconductor component a second dopant profile, which has a greater depth than the first dopant profile.

The second dopant profile may also be referred to as the final dopant profile. However, the latter also includes changes in the dopant profile produced in the stack after the heat treatment, insofar as further heat treatments or etching steps—for example, to remove impurities—take place in the semiconductor material. In particular, there is also the possibility in terms of this aspect that, in opposite-lying sides, that is, surfaces of the chip- or wafer-shaped semiconductor components, layers that contain the dopant are formed. These bring about not only the accumulation and collection of impurities from the interior of the semiconductor component during heat treatment, but also protect the semiconductor material from penetration of external impurities during heat treatment.

In particular, it is provided that, prior to the arranging of the semiconductor components in a stack, each semiconductor component is subjected to heat treatment so that volatile constituents present in the oxide film layer, in particular organic constituents, are removed or converted, so that, during the heat-treatment process subsequently carried out in the stack, it is ensured that the semiconductor components do not adhere to one another and accordingly can be separated subsequently without any problem, so that damage will be excluded.

In an enhancement of the invention, it is provided that a liquid dopant source is applied or dopant is sputtered, in order to produce the oxide film on the semiconductor component. In doing so, the liquid dopant source can be applied by atomization, spraying, nebulization, vaporization, transfer printing, nip rolling followed by condensation, or dipping methods on the semiconductor component. However, there is also the possibility of applying the dopant source by a wetting method. Thus, the liquid dopant source can be applied via a transfer means, such as a roll, to the semiconductor component.

In the case of a p-conducting silicon starting material, it is possible to use as the liquid dopant source a phosphorus-containing solution, a converted phosphoric acid solution, and/or a phosphorus-containing sol-gel solution. A phosphorus-containing paste can also be applied or a dopant, such as, for example, $P_2O_5$, can be sputtered. If the semiconductor substrate comprises silicon, a phosphorus silicate glass film is consequently formed as the oxide film layer.

If, by contrast, an n substrate made of silicon is employed as the base substance, boron-containing solutions can be used, for example, as liquid dopant sources, so that a borosilicate glass film is obtained as the oxide film layer.

Obviously, the invention is not limited to silicon as the base substance. Instead, all other semiconductor materials and dopants that are suitable for manufacturing semiconductor components, in particular semiconductor components for transforming light into electrical energy, come into consideration.

A two-stage thermal method is proposed in accordance with the invention, in which a first process step is characterized in that a temporally provisional dopant depth profile is produced at high process temperatures, such as 500° C. to 1100° C., preferably up to 1000° C., and the substrate layer near the surface has typical properties. In accordance with the invention, a liquid dopant source can be placed on the surface of the semiconductor component and dried in a first thermal step so that a provisional dopant depth profile is established and the surface of the dopant source is made insensitive to damage due to mechanical influences, such as, for example, scratching and rubbing, and chemical influences, such as, for example, moisture. In particular, the established property of the layer near the surface is characterized in that adhesion of this layer to other components is prevented insofar as possible.

The provisional or first dopant depth profile is characterized in that the provisional profile enabling separation of charge carriers has a depth $T_V$, starting from the surface of the semiconductor component, of preferably $T_V \leq 0.2$ μm.

During the first treatment stage, the semiconductor components are separate. By contrast, during the second heat-treatment stage, the semiconductor components are coupled.

Although the first treatment stage preferably involves a heat-treatment of the aforementioned kind, the provisional profile can be produced, if need be, also at room temperature.

The drying of the dopant source of the chip-shaped semiconductor components, such as, for example, components made of polycrystalline silicon, is conducted at temperatures above 500° C., in particular in a range between 800° C. and 920° C. On account of this first process step, it is possible in accordance with the invention to carry out the following process step without causing damage to the semiconductor components or inhibiting the penetration of the dopant atoms. Thus, in accordance with the invention, the corresponding heat-treated semiconductor components are stacked in the following step in order to carry out a further heat treatment. The stacking affords the advantage of an especially low-contamination production of dopant depth profiles and, simultaneously, an economical procedure, since, on account of the stacking, there is the possibility of achieving a high throughput during use in conventional process plants for the same residence time. In particular, however, there results the advantage of achieving a longer heat treatment with comparable throughput, which results in a greater penetration depth of dopants. Alternatively, it is possible to employ process plants that have a shorter structural length than those previously employed, so as to achieve the same throughput during the same process time in comparison to the methods previously employed for implanting the dopant. This, too, results in economic advantages.

In particular, it is provided that, in the case of a semiconductor component made of a polycrystalline silicon material as the base substance, the formation of the oxide film layer is carried out at a temperature $T_1$ with $500°$ C.$\leq T_1 \leq 920°$ C. Furthermore, the semiconductor components are arranged in the stack relative to one another so that these components lie essentially flat on top of one another. This notwithstanding, it is provided that the semiconductor components can be incorporated in a centering housing in order to achieve a simple stacking.

In order to largely prevent or exclude damage, the respective semiconductor component to be laid down during stacking of the semiconductor components should be deposited onto already stacked semiconductor components insofar as possible only by its own weight.

In accordance with a variant of the teaching in accordance with the invention, the stacking of the semiconductor components can take place in such a way that the stack being formed runs at a horizontal incline and the semiconductor components being stacked are guided into place on the stack by positioning aids.

Heat treatment of the semiconductor components present in the stack can take place batchwise. A continuous procedure for producing the desired dopant profile is equally possible.

In order to prevent contamination, the means by which the semiconductor components come into contact during heat treatment should comprise high-purity semiconductor materials, such as silicon, high-purity quartz, and/or high-purity ceramics. The semiconductor components or the stack are supported or guided via appropriate aids.

This notwithstanding, the semiconductor components are stacked so that the density of the stack is essentially identical to the density of the semiconductor components. As a result, it is ensured that the semiconductor components lie flat on top of one another, so that, according to a proposal in accordance with the invention, the related heat treatment of the semiconductor components conducted in the stack is used in order to prevent a displacement of individual semiconductor components, that is, to provide smooth or even or at least less wavy semiconductor components.

The heat treatment taking place in the stack is also characterized in that the number of crystal defects, in particular the number of dislocations, is markedly reduced in silicon semiconductor components by means of heat treatment at a temperature $T_4$ with $800°$ C.$< T_4 < 1380°$ C. There results the further advantage that, in wavy silicon semiconductor components, which can have strains and mechanical stress, the waviness or the stress in the silicon material is markedly reduced by heat treatment at a temperature $T_4$ with $800°$ C.$< T_4 < 1380°$ C.

It is further of advantage that the contact properties of the metal contacts of the semiconductor components can be improved by heat treatment in the stack arrangement in a forming-gas atmosphere or in another hydrogen-containing atmosphere.

If semiconductor components manufactured according to the EFG method are stacked, the density of the stack should preferably correspond to 0.5 to 0.2 times the density of the semiconductor component material.

The method in accordance with the invention for manufacturing semiconductor components as well as the associated process engineering should be viewed in terms of a complete integral fabrication process for industrial semiconductor components for transforming light into electrical energy.

The focus here lies on heat-treatment processes for implanting dopant atoms and subsequent treatment steps for producing n-doped regions in p-doped semiconductor components. However, the invention is not limited in any way to these. Other semiconductor components or other dopings can also be produced advantageously using the described sequences and procedures.

Semiconductor components manufactured according to this invention are characterized in that, among other things, they have relatively deeply diffused regions at least on portions of the surface, which are produced in a heat-treatment process for implanting dopant atoms that is very long in relation to industrial mass production.

The described method for implanting dopant atoms in thermal processes for semiconductor components permits two advantageous applications:

On the one hand, the production throughput can be dramatically increased in existing production lines, without having to shorten the process time or having to increase the plant size for the thermal processes for implanting dopant atoms. At the same time, improved process purity and a larger process window can be achieved.

On the other hand, it is possible, while maintaining or even increasing throughput of the production lines, to use markedly longer process times for implanting dopant atoms, without having to increase the length of process plants significantly or having to increase process costs significantly.

A key feature of the invention is a thermal-treatment method for implanting dopant atoms in semiconductor components, which, in a first partial process step, provisionally applies first of all a dopant source to the surface or portions of the surface of semiconductor components.

Various methods and dopant sources are considered for this, such as are fundamentally known from the prior art. Included here are, among others, phosphorus dopant sources, such as phosphoric acid, converted phosphoric acids, sol-gel phosphorus compounds, $POCl_3$, P-containing pastes, sputtered P compounds, such as $P_2O_5$, and other phosphorus compounds, which are applied to the surfaces or portions of the surfaces of semiconductor components by way of various deposition methods, such as condensation, vaporization, vapor deposition, droplet spray coating, dipping methods, atomization methods, printing methods, inscribing methods, or sputtering.

Instead of applying a dopant source for producing the layer containing the dopant atoms, the atoms can also be introduced or implanted by, for example, ion implantation of the dopant.

In a second partial process step, the dopant source applied in this way is converted in an appropriate heat-treatment step. In doing so, volatile constituents of the dopant source are removed to a certain extent from the dopant source under the influence of temperature—up to process temperatures for implanting dopant atoms—and a doping film is produced on the semiconductor component. The temperature-time profile during the conversion of the dopant source as well as the process atmosphere are chosen here so that the resulting doping layers satisfy the following process requirements and are optimized for them. Furthermore, this process is carried out in a process plant that, apart from the dopants, introduces no impurities and, in particular, no metal impurities into the semiconductor components or contaminates their surfaces with these impurities. During conversion of the dopant source into an appropriate doping film, heating ramps, maximum temperature, cooling ramps, process-gas atmosphere, process-gas control, and exhaust-gas control are designed so that the resulting doping films are sufficiently homogeneous, do not contain any impurities and, under the influence of temperature, volatile substances of the dopant source are specifically removed from the process chamber, without allowing undesired condensation or droplets of condensation to be formed on the semiconductor components.

In this partial process, the surfaces occupied by the dopant source are preferably not in contact during the process with a transport system or carrier materials for the semiconductor components.

In a third partial process step, the large-area semiconductor components are arranged on top of one another or next to one another in a stack. In this way, very many semiconductor components are arranged in a relatively small volume and on a small base surface (support surface). Consequently, the sum of the surfaces of the semiconductor components is a multiple of the base surface of the stack arrangement. Accordingly, it is possible to process very high numbers of semiconductor components per unit of time in an appropriate thermal treatment oven for implanting dopant atoms (diffusion) on a relatively small base surface for the process. This can be implemented both in a continuous process for implanting dopant atoms and in (closed) process chambers for this purpose, which are loaded and unloaded.

In doing so, the stack can be covered at its ends, that is, its faces, with cover plates in order to prevent impurities from penetrating. The cover plates can also serve to stabilize the stack.

As a result of the compact arrangement of the semiconductor components in terms of volume—instead of the greater discrete separations of these semiconductor components in accordance with the prior art—very long process times and a high throughput with acceptable process times and acceptable production space requirements as well as acceptable process system costs are mutually compatible.

When the dopant source is appropriately converted in a preceding partial process step, the method additionally provides contamination protection for the semiconductor components and the surfaces thereof. As a result of the fact that the surfaces of the components lie directly on top of one another, these surfaces are protected to the greatest extent possible from impurities due to contact with oven materials or against the transport of impurities via the gas phase to these surfaces. An additional protection results from the dopant layers on the surfaces, which can collect impurities from inside the semiconductor components during the implantation of dopant atoms and can prevent impurities from the outside from penetrating into the semiconductor components.

Accordingly, it is possible to adjust the process time and the process temperature for implanting dopant atoms as well as the corresponding heating and cooling ramps to the respective semiconductor material within very large ranges, so that defects and impurities in the semiconductor material can be minimized by this thermal treatment step.

In particular, it is provided that, in the process step previously referred to as the third partial process step, which, in actuality, is the second key process step of the present invention, the second dopant profile is produced, which is referred to as the final dopant profile, insofar as changes in the dopant profile resulting from subsequent further thermal treatment steps or etching steps, which may be necessary, particularly for removing impurities, are ignored. The semiconductor components arranged in the stack are thermally treated preferably over a time period of at least 10 to 20 minutes up to 24 hours, during which the semiconductor components are maintained at a temperature that, in the case of polycrystalline silicon, preferably lies in a range between 800° C. and 1000° C. The time here includes the holding time. In general, however, it may be stated that the second main process step, that is, the heat treatment of the semiconductor components in the stack in a temperature range between $T=800°$ C. and $T<T_5$, with $T_5$=melting point of the material in the semiconductor component, is carried out over a time period t with $0<t\leq24$ h.

In a highlighted, independently inventive embodiment, it is provided that, after the production of the desired second doping profile, doped surface regions of the semiconductor component are removed region by region. This removal is conducted particularly by etching or oxidation. It is ensured through this measure that, in the regions that are not removed, a high dopant concentration is present and, as a result, a good electrical contact with a front contact can take place to the required extent.

However, removal need not necessarily take place physically. Of equal effect is a conversion in the surface region, such as oxidation.

The regions that undergo a reduction in dopant concentration at the surface and are exposed directly to radiation that is to be transformed into electrical energy have a low concentration of defect sites, because defect sites, like metal impurities, are introduced only in highly concentrated regions during implantation of dopants due to thermal treatment. Furthermore, the removal of doped regions also leads to a lower dopant concentration, because dopants are also to be regarded as defects in the semiconductor. On account of the low concentration of defect sites, undesired recombination is also reduced.

In other words, the emitter layer in a semiconductor component for transforming light into electrical energy is selectively partially removed or back-etched, with the regions in which the semiconductor material is removed usually serving for energy transformation and, in the remaining regions in which the surface has not been removed, a contacting can take place with the front contacts. It should be mentioned in this regard that, to this end, a high density of doping atoms is desirable.

Furthermore, there ensues the advantage that impurities are removed by selective removal of the surfaces in regions in which the radiation that is to be transformed by the semiconductor component impinges.

Notwithstanding the removal of the surface region, the efficiency of a corresponding semiconductor component for transforming light into electrical energy is not affected detrimentally, because, on the basis of the teaching in accordance with the invention, the dopant profile, that is, the region with the dopant atoms implanted from the surface, extends sufficiently deep into the semiconductor material.

Accordingly, it is possible in a fourth partial process step or in a plurality of necessary partial process steps to remove specific regions of the previously diffused zones. Coming into consideration for this are etching methods or oxidation methods or ablation methods or combinations thereof, which oxidize and/or etch away and/or ablate specific regions of the previously doped areas of the semiconductor components. These regions are regions having a very high dopant concentration in the semiconductor and accordingly regions in which impurities have preferably accumulated. These regions are etched away together with the dopant source in a reproducibly homogeneous or selective manner, so that emitter regions that have a relatively low dopant concentration remain at least primarily at sites that receive light.

Vaporization, in particular laser ablation, also comes into consideration for removing doped surface regions.

The dopant surface concentration c in the emitter for implanting phosphorus, for example, should lie, after conclusion of the process chain, in a range of $5 \times 10^{16}$ to $10^{20}$ P atoms/cm$^3$, preferably between $10^{18}$ and $5 \times 10^{19}$ P atoms/cm$^3$. The penetration depth of the emitter, that is, the depth of the pn transition from the surface, then runs relatively deep and is preferably greater than it would be for typical industrial semiconductor components for transforming light into electrical energy, for which the emitter depth lies in a range of 0.3 to 0.5 µm. In accordance with the invention, emitter depths in a range of between 1 µm and 10 µm are obtained, which, notwithstanding markedly lower P surface concentrations in the emitter, make possible a sufficient conductivity of the emitter. The stated depth of at least 1 µm relates to the surface of the semiconductor component, without selective removal of the emitter taking place, whether by physical removal or by oxidation, for example. In the regions in which regions of the emitter layer have been previously removed, the effective depth of the emitter layer extends preferably up to a range between 0.3 µm and 9.7 µm, in particular for a semiconductor component that is made of silicon as the base material. It is assumed in this statement that the thickness of the emitter layer should be at least 0.3 µm.

The thickness d of the respectively removed layer is preferably $0 < d \leq 0.3$ µm and is in fact independent of the aforementioned additional parameters. The remaining emitter thickness should be $\geq 0.3$ µm.

The invention is evidently not limited to semiconductor components that comprise a polycrystalline substrate made of silicon. Instead, a monocrystalline material, such as silicon, can also be used. In doing so, a heat treatment over a time period of about 10 minutes at a temperature of about 1100° C., for example, can be conducted to produce the provisional dopant profile. As a result, effective penetration depths of the dopant of up to about 2 µm are formed. After conclusion of the heat treatment of the semiconductor components arranged in the stack, that is, after the second heat-treatment step, the effective depth extends to 5 µm or more, preferably with a surface dopant concentration in the range of $10^{18}$ to $10^{19}$ atoms/cm$^3$ being aimed at as the final surface concentration after finishing the semiconductor component.

Obviously, all of these values are mentioned by way of example, without any limitation to the teaching in accordance with the invention resulting from this.

It should be further noted that the time periods given for producing the provisional dopant profile include heating and cooling.

Advantages of emitters having lower dopant concentrations are higher minority charge-carrier lifetimes for charge carriers that are produced by absorption of light in the emitter region. Together with a possibly improved surface passivation on such surfaces having lower dopant concentration, it is accordingly possible to manufacture semiconductor components with improved light yield for short-wavelength portions of the transformable sunlight spectrum. However, an improved light yield is also to be expected for medium- and long-wavelength light portions, because, due to the lower dopant concentration, the parasitic absorption of these portions of the sunlight spectrum in the emitter region is reduced and accordingly these light portions penetrate more completely into the volume of the semiconductor component and are able to contribute there to an increased production of minority charge carriers. In addition, it is possible, using the longer process for implanting dopant atoms at relatively lower temperature, to enrich impurities from the interior of the semiconductor component more effectively initially in highly doped regions of the emitter and subsequently, if need be, to etch them away or convert them together with these regions of the emitter. None of these advantages are offered by the prior art.

Alternatively, the previously described advantageous emitters having a lower P surface concentration and a higher penetration depth can also be produced by removing the doping layer from the semiconductor surface after the partial process step of converting the dopant source and by implanting deeper only those dopants that, at this point in time, have already been incorporated into the semiconductor in the following stack process for implanting dopants.

In accordance with the invention, there is the possibility of selectively removing emitter layers. The regions in which a partial removal of emitter regions, which includes a conversion, does not take place have a high dopant surface concentration and are diffused very deeply. These regions can be contacted with low contact transition resistance. The other regions of the emitter that are to transform sunlight into electrical energy selectively have emitters with largely lower dopant concentration, albeit relatively deeper dopant penetration depth, so that a better yield of short-wavelength portions of the usable sunlight spectrum is made possible. In accordance with the invention, a masking step for the light-receiving side of the semiconductor component for transforming photons into electrical energy should be employed for producing correspondingly selective emitters after the actual implantation of dopants in the wafer stack, this masking step leaving the regions that are to be contacted later in the process sequence masked at least partially or else completely, and left unchanged, when the other emitter regions are etched back.

It is basically simple to produce contacts having low contact transition resistance to emitters with very high dopant surface concentrations. The problem in contacting selective emitters usually consists in reproducibly aligning the regions in which the dopants have been deeply implanted in the stack during heat treatment and the metal contacts with respect to one another in mass production processes, so that the more weakly doped regions of the selective emitter, which have a lower dopant surface concentration, are not contacted by the metal contacts. Usually, those regions that are not aligned suitably with respect to one another entail appreciable risks of drastically lowering the maximally achievable efficiency, because, during the contacting of weakly doped emitters having lesser penetration depth, recombination losses can result from impurities in the pn transition and, in some circumstances, short-circuit paths may result.

In the case of emitters according to the invention that are deep, but are provided with lower dopant surface concentrations, however, this probability is markedly reduced, because there is hardly any impairment of the emitter in emitter regions having lower dopant surface concentrations, but still having relatively deeper penetration depth of the dopant profile, when metal contacts are produced using metal pastes, in comparison to highly doped emitter regions, which are to be contacted, and impurities do not reach the semiconductor transition because of the deep placement of the emitter. Accordingly, a selective emitter produced in this way is markedly less sensitive to the perfect alignment of emitter regions having high dopant surface concentration relative to the metal-paste contact regions. There thus results a relatively large process window, which tolerates deviations and imprecisions in the alignment of the regions with respect to one another.

In order to be able to carry out the process sequence provided in accordance with the invention for implanting dopant atoms from the surface of semiconductor components, the systems engineering described below can be employed, these engineering techniques having their independent inventive content and being separate from the process according to the invention for implanting dopant atoms. The plant features, even when they are described below in connection with the method of the invention, are also to be regarded as inventive in themselves.

Various production units are necessary for manufacturing semiconductor components according to the invention. In this process, diverse production units, which already belong to the prior art, can be employed for the partial process steps, such as the application of the dopant source and the suitable conversion of the dopant source into an adequate doping film or oxide layer film, which contains the dopant or dopants. Key in terms of the invention, however, are systems engineering and associated process engineering for forming stacks of large-area semiconductor components, which allow a very high sum of surfaces of individual large-area semiconductor components introduced into the stack, on very narrow volumes. These processes and the associated systems engineering are characterized in that the semiconductor components are received from a preceding process without any damage and then compacted into a stack, which, through suitable handling technique, is placed in a thermal system for implanting dopant atoms into semiconductor components and removed once again with as little damage as possible. Also included here is systems engineering that separates the large-area semiconductor components once again from the stack arrangement without damaging these semiconductor components.

Suitable aids are employed for forming the stack arrangement, ensuring that the stack arrangement thus formed can be produced reproducibly, so that the arrangement can be handled and relative movements of the semiconductor components with respect to one another do not occur. Furthermore, the shape of the stack arrangement must be such that, during the actual fabrication process for implanting dopant atoms in the semiconductor components, there does not occur any significant displacement of these semiconductor components with respect to one another and any damage to or contamination of surfaces, and such that, after conclusion of this high-temperature process, the stack arrangement can be taken apart once again, without damaging semiconductor components, or the latter can be returned once again as individual components to the next production unit with the desired cycle time and positional accuracy.

Diverse automated handling systems come into consideration for the handling units, which can pick up the wafers via low-damage gripping mechanisms and place them down with positional accuracy, as well as transport lines, which align the semiconductor components with respect to one another into the desired stack form automatically via conveyor lines. It is important in doing so not to damage, scratch, or contaminate the semiconductor component surfaces. Automatic grippers or other known separation mechanisms can also be employed in this case in order to separate out of the stack arrangement the large-area semiconductor components after implantation of dopant atoms. Here, too, no damage whatsoever may be inflicted on the surfaces.

In order to stabilize the shape of the stack-like compacted arrangement of semiconductor components during transfer or loading of this structure into a suitable oven for implanting dopant atoms, during transport through this oven, or during unloading and transfer to the next unit and in order to protect the respective outer large-area semiconductor components—depending on the arrangement, the uppermost or bottommost semiconductor component or the frontmost or backmost semiconductor component—it is advantageous and in the sense of this invention to employ shape-imparting or shape-stabilizing components, by means of which the stack-shaped arrangement can be transported in a simplified manner. In the simplest case, these are plates above and below an arrangement of large-area semiconductor components stacked one on top of another. It is equally possible, however, to use housings for the stack-shaped arrangement (transport boxes). Here, it is also possible, for example, to arrange the large-area, relatively thin semiconductor components primarily vertically, resting next to one another on their edges. Decisive for the selection of transport aids, which are to stabilize the stack, is the choice of material, which must contribute to making sure that no undesired impurities enter the semiconductor components or come onto their surfaces. Furthermore, the transport aids may not have a detrimental effect on the temperature homogeneity of the semiconductor components during implantation of the dopants from the dopant source, but rather they should improve the temperature homogeneity. In particular, it must be ensured that, in spite of the transport aids, all large-area semiconductor components experience essentially the same temperature-time courses during thermal treatment for implanting dopant atoms. The choice of material is accordingly restricted to materials that are compatible with ultraclean thermal processes at high process temperature and with processes for implanting dopant atoms for semiconductor components of the respective generic kind. Coming into consideration here for Si semiconductor components are pure ceramic materials, such as, for example SiC, $Al_2O_3$, and quartz, or semiconductor materials, such as, for example, silicon. The design should be adjusted to the requirements placed on temperature homogeneity and the requirements for damage-free transport of the stack arrangement. In particular, if high-purity semiconductor material of the same kind as that used for the semiconductor components to be processed is used for the transport aids, no notable relative movements between the stack arrangement and the transport aid components will be able to occur due to different thermal expansion coefficients. Moreover, it should be possible to handle the arrangement by automatic handling techniques.

Preferably, the stack arrangement with the large-area semiconductor components should be processed in continuous high-temperature treatment ovens. For arrangements of up to 100 semiconductor component chips lying one on top of the other, it could be ascertained that the temperature homogeneity for typical processes for implanting dopant atoms by using moderate heating ramps and a longer holding time of more than 10 min, in particular of more than 60 min, at the maximum process temperature in each case for implanting dopant atoms, could be improved if the semiconductor components in the stack arrangement are processed as individual parts. Furthermore, the process time for implanting dopant atoms could be prolonged, without reducing the throughput of semiconductor components in this process step for implanting dopant atoms. In contrast, it has been found that markedly higher throughput and/or markedly increased process times are possible and, in the process, the efficiency of the semiconductor components for transforming light into electrical energy that have been manufactured at the end of the process chain can be increased. This can be ascribed, on the one hand, to the increased process time for implanting dopant atoms and the associated advantages of minimizing electrically active impurities in the semiconductor. On the other hand, the arrangement results in an inherent protection against external impurities present in the oven. This applies in particular to oven arrangements, such as continuous high-temperature ovens for implanting dopant atoms in semiconductor components, with metal mesh belts for transporting components, but also to other types of oven, which, on account of the wafer transport or components in the oven, can lead to impurities in semiconductor processes.

Ideally, however, in the sense of this invention, the stack arrangements with their respective ultraclean transport aids are transported through a continuous high-temperature oven in such a way that no components whatsoever need be exposed to a risk of contamination in the heated process interior of this oven for implanting dopant atoms in semiconductor components. Because the choice of material for the transport of semiconductor component stack arrangements is hereby very limited, a preferred oven design is a continuous oven, the process chamber of which is delimited by a quartz tunnel from the heating elements located around it. Transport through this process chamber can take place, for example, using a hoist-step conveyor system, which, for example, uses long rods or pipes made of ultraclean materials suitable for semiconductor processes (quartz, SiC, high-purity ceramic). Here, the rods or pipes extend through the entire heated process chamber and are moved in a synchronized manner outside of this process chamber on adequate supports. Each stack arrangement is supported in this way, together with the possibly associated transport aids, at each point in time by at least one rod or two pipes. These rods or pipes can be moved along the desired transport direction through the oven interior (stepping) and vertically (hoist movement). If the wafer stacks are not deposited in the oven interior on support surfaces for a short time, at least two additional rods or pipes are necessary. These should be moved in parallel and, in addition, in a synchronized manner as well. By using such an arrangement, it is possible to complete one forward movement for the semiconductor components in the desired transport plane in each case. After a defined forward movement by the distance X1, the second arrangement with rods or pipes is raised once it has moved onto a plane below the transport plane by the distance −X1 opposite to the transport direction. Upon reaching the transport plane by way of the second arrangement of rods or pipes, the respective stack arrangement is now supported also by these rods or pipes in a symmetrical manner with respect to the center of the stack arrangement and the first arrangement with rods and pipes can be lowered again.

In the next step, the stack arrangements, together with the semiconductor components, are moved forward again by the distance X1, while the first arrangement with rods or pipes is retracted onto the lowered plane by −X1. At the end of the distance, the first arrangement with rods or pipes receives the stack again in a symmetrical manner with respect to its center at the level of the transport plane and the second arrangement with rods and pipes is lowered again. Using this hoist-step principle, it is possible to convey stack-shaped arrangements of semiconductor components with uniform speed nearly continuously through the process chamber.

Alternatively, to this end, the stack arrangement can be set down in the oven for a short time, in each case after the step movement, on support surfaces suitably introduced for this, while the rod(s) or pipes conveying the stack are retracted opposite to the transport direction.

The transport rods or transport pipes, which are each in contact with the stack arrangement of the semiconductor components, do not contaminate the arrangement and lead to no relative movement in relation to the stack arrangement. Since these supports are each transported only a relatively short distance forward and again backward in the oven, these components need not be continuously heated, but rather remain nearly steadily at the same temperature. This promotes temperature homogeneity during transport of the stack arrangement and largely prevents parasitic heating power for the transport mechanism. As a result of this construction, the oven length is limited to the length of the high-purity rods or pipes, which extend through the oven interior. However, because it is possible to transport the stack together with semiconductor components on a plurality of tracks adjacent to one another and the stack arrangements with up to 200 or even more semiconductor components can be transported on a relatively small base surface (not larger or slightly larger than the chip-shaped semiconductor components), it is possible, using a heating oven length of a few meters and a process time in the range of, for example, 1-5 hours, to achieve a typical throughput of several thousand semiconductor components per hour.

In the case of continuous high-temperature ovens with metal-mesh transport belts employed hitherto for implanting dopant atoms in semiconductor components for transforming light into electrical energy, it is possible, even for a typical throughput of one large-area semiconductor component per second, to use process times (at maximum constant temperature for implanting dopant atoms) of up to one day, without increasing the oven length, provided only that the stack arrangement comprises a sufficient number of semiconductor components (for example, ~350 pieces). Typical process times for such throughput have hitherto been approximately 10 minutes.

So-called discontinuous high-temperature ovens can also be used for implanting dopant atoms in semiconductor components for which the stack arrangement is loaded and then the process is carried out in a large process chamber and, finally, the oven is again unloaded. Suitable for this purpose are, for example, ultraclean chamber ovens.

A continuous high-temperature treatment oven for implanting dopant atoms in semiconductor components offers the advantage that, in principle, each semiconductor component passes through the same temperature profile and the heating power remains nearly constant.

Another advantage of the described method, which allows long process times in the range of hours during implantation of dopant atoms when stack-shaped arrangements of semiconductor components are processed, is that semiconductor materials with strains and irregular, wavy surfaces, such as, for example EFG silicon (edge-defined film-fed growth) or other so-called ribbon-drawn silicon materials or film silicon materials are reduced in their waviness by the long thermal treatment, that is, they can be smoothed and thereby thermal strains of the preceding process they can be relieved or diminished. An independent inventive concept can be seen herein, that is, a concept separate from the process steps for implanting dopant atoms in semiconductor components in accordance with the invention.

Tests have shown, for example, that, in stacks made up of wavy EFG Si substrates, the waviness of the individual Si substrates is reduced. The force with which the substrate surfaces are pressed against or onto one another in the stack arrangement also plays a role in this. In particular, in the case of substrate stacks that lie horizontally on one another, the number of substrates present in the stack and the weight of possibly above-lying transport-aid components is of importance. Preferably, therefore, up to 200 to 300 semiconductor components should be layered so as to lie one on top of another horizontally to form a stack and should have above them a plate made of semiconductor material that weights the stack and prevents the components from slipping.

Another preferred application provides that, after the first heat-treatment step, during which an oxide layer containing a dopant is formed on the semiconductor component surfaces, this oxide layer is removed, so that, in the subsequent heat-treatment step for implanting dopant atoms in a stack arrangement, only dopant that was already previously introduced in the semiconductor component (first heat-treatment step) is introduced. In this way, it is possible to markedly decrease the surface concentration of dopants already during the implantation of the dopant profile in the stack arrangement and to produce a deep dopant penetration depth profile, as was described above as being advantageous. Thus, it is possible, for example, without etching processes that remove portions of the semiconductor material, to achieve dopant surface concentrations for phosphorus, for example, that lie at $10^{18}$-$10^{20}$ P atoms per $cm^3$, even though, previously, a dopant source with a very much higher dopant concentration was used, which, after the first heat-treatment step, implanted dopant concentrations of $\gg 10^{20}$ P atoms/$cm^3$ in the semiconductor component surface. The removal of the dopant source or of the so-called dopant silicate glass in the case of silicon semiconductor components is preferably carried out in fluoric acid (HF) or in chemical solutions that contain fluorine compounds that can release fluoride ions or by vapor treatment. Suitable for this purpose are, in particular, continuously operating plants with roller transports for wet-chemical processing of the semiconductor components.

Another advantageous variant of the teaching described here is to place dopant sources both on the light-receiving side of the flat semiconductor component for transforming light into electrical energy (solar cell) and on the opposite-lying side, so as to be able subsequently to implant dopants from there in the semiconductor component. In this way, it is possible, particularly in the case of polycrystalline semiconductor components, such as, for example, polycrystalline silicon or ribbon-drawn silicon (EFG, string ribbon, RGS, etc.), to effectively collect impurities in the semiconductor material during implantation of dopants from all surfaces provided with diffusion sources and accordingly render them harmless. As a result, the probability for the removal of impurities in the semiconductor material increases appreciably. In doing so, it may be helpful, after implantation of the dopants from the surfaces, to remove again partially or completely the thus-doped region of the semiconductor component in one of the following process steps. This is necessary, for example, when the light-receiving side of the semiconductor component for transforming light into electrical energy is ultimately to receive a doping different from that of the opposite-lying side, although initially the same dopant was implanted on both sides, in order to remove impurities from the semiconductor component more effectively.

This notwithstanding, the density of the stack can, if necessary, be roughly identical to the density of the semiconductor components; that is, it is ensured that the semiconductor components lie flat one on top of the other in order to achieve the desired smoothing. In other words, the stack density can be about 2.3 g/$cm^3$, provided that what is involved in the case of the chip-shaped semiconductor components are those made of silicon.

If, for example, semiconductor components manufactured according to the EFG method are stacked, the density of the stack should preferably correspond to about 0.5 to 0.2 times the density of the wafer material, as a result of which, regardless of the waviness that is present, it is ensured that the wafers do not break. At the same time, however, there results a reduction in the waviness, that is, a smoothing, on account of the heat treatment of the wafers that takes place in the stack.

Besides the applications for implanting dopant atoms and for smoothing wavy ribbon-drawn polycrystalline silicon semiconductor components (such as, for example, EFG Si). Other heat-treatment methods are considered, for which a stack arrangement of the semiconductor components offers an appreciable advantage, because, in this way, very long process times can be used and, for suitable heat-treatment systems and a suitable number or compaction of stacked semiconductor components in the process chamber, it is nonetheless possible to achieve very high throughput of semiconductor components. Accordingly, heat-treatment steps that were hitherto inconceivable economically become of interest for the industrial mass production of semiconductor components for transforming sunlight into electrical energy.

Such a heat-treatment step is, for example, a method in which the semiconductor components are subjected to another heat treatment at approximately 500° C.-800° C. after implantation of dopant atoms at the process temperatures of 800° C.-1100° C. typical for this. In the former temperature range, the already implanted dopant atoms are not forced appreciably further into the semiconductor component. However, it is known from the literature [M. Rinio et al., Proc. 23rd EPVSEC, p. 1014 (2008)]; [T. Buonassisi et al. NREL Workshop on Crystalline Si Solar Cells and Modules (2007)] that such additional heat-treatment steps for improving the material quality (higher minority charge-carrier lifetime) lead to semiconductor components that are contaminated or that are afflicted with crystalline defects. It is also known from the literature that, in this case, long process times are advantageous.

It is further known from the literature [B. Sopori; Dehli, India, November 1999, NREL/CP-520-27524 "Impurities and Defects in Photovoltaic Devices . . . "] that it is also possible to use very long heat treatments (up to 1-2 days) at relatively moderate temperatures so that impurities present as precipitate clusters in the semiconductor component detach from the precipitate cluster and become mobile as interstitial impurities in the semiconductor and accordingly can be collected on the surfaces of the semiconductor components through the dopant accumulations or can even be removed in the following process steps, such as etching. Moderate temperatures in this case are temperatures below the typical temperatures used in industrial fabrication of semiconductor components for transforming light into electrical energy in order to implant dopant atoms from a dopant source placed on the surface regions into the semiconductor component by way of this heat treatment.

Another advantageous application example for high-temperature treatment steps in stacked-shaped arrangements of semiconductor components is also a method already described in the literature [K. Hartmann et al., Appl. Phys. Lett. 93, 122108 (2008)] in which semiconductor components, such as, for example, polycrystalline silicon wafers or ribbon-drawn Si wafers, after manufacture thereof (crystallization and wafer cutting), are subjected to another high-temperature treatment step (typically at temperatures of between 1100° C. and the melting point for the semiconductor components) in order to markedly reduce crystallographic defects, such as, for example, dislocations. Here, too, long process times and a high throughput are advantageous and indispensible in order to develop industrially applicable processes. In parallel, thermal strains in the semiconductor component are annealed or markedly reduced in such temperature processes markedly above 1000° C. and for long process times. Parallel to this, wavy surfaces, such as are common for ribbon-drawn polycrystalline silicon materials (e.g., EFG) are made nearly completely flat by the stack treatment. This offers appreciable process advantages in the further process chain for semiconductor components for transforming light into electrical energy. The rate of breakage in subsequent processes can thereby be reduced markedly for semiconductor components.

Yet another advantageous example of application for processing partially finished semiconductor components for transforming light into electrical energy in stack-shaped arrangements is to carry out a so-called forming-gas anneal (FGA). In doing so, the semiconductor components, already provided with sintered metal contacts, are subjected to a hydrogen-containing gas atmosphere. Usually, a mixture of an inert gas, such as nitrogen or argon, with hydrogen is used for this. The proportion of hydrogen in this case is chosen such that, at the corresponding process temperatures, an explosion of the gas mixture cannot occur, even in the event that air enters the process interior. Heat treatment of the already sintered/baked metal contacts (produced from, for example, Ag, Ag/Al, or Al pastes with glass components) improves the contact properties of these metal contacts (see [Gunnar Schubert, Ph.D. Thesis, University of Konstanz (2006), "Thick Film Metallization of Crystalline Silicon Solar Cells Mechanisms, Models, Applications"]) at temperatures between 250° C. and 450° C. for process times of approximately 10 to 120 minutes. Because a longer heat treatment is required, it is also advantageous here to process the solar cells in compact arrangement (stack). The process can be carried out in closed ovens, in which the process atmosphere can be controlled more easily. But, in principle, continuous ovens with correspondingly adapted control of gas in the interior are suitable for this as well. The heat-treatment step carried out in this way in a forming-gas atmosphere leads to a marked improvement of the fill factor in the current-voltage characteristic of semiconductor components for transforming light into electrical energy. In particular, metal contacts that have not been ideally baked/sintered can be improved. Accordingly, at the same time, there is obtained a larger process window for the production of these semiconductor components for transforming light into electrical energy.

Figure 2:
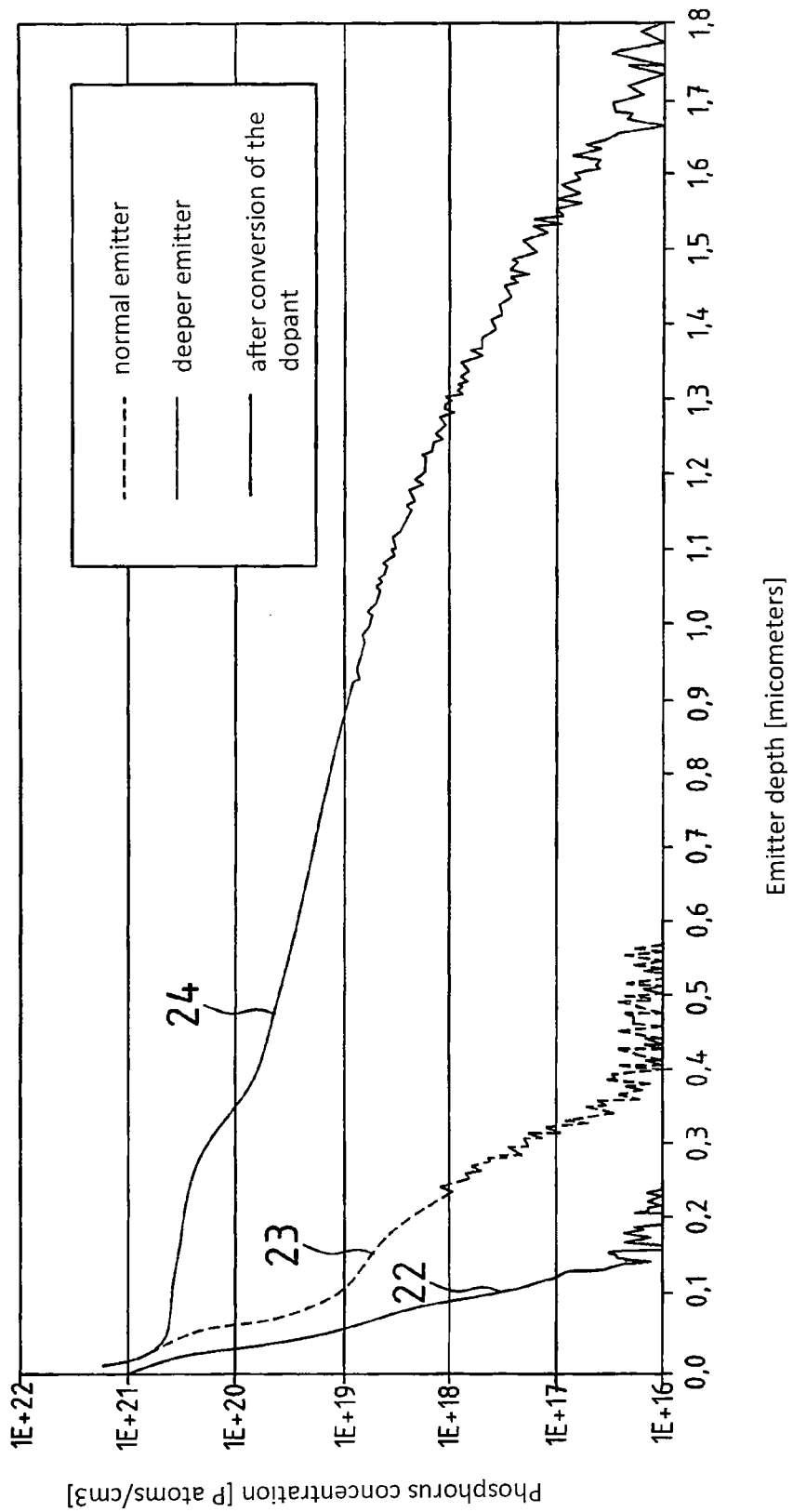

Further details, advantages, and features of the invention ensue not only from the claims and the features to be taken from these—in themselves and/or in combination—but also from the following description of the preferred exemplary embodiments to be taken from the drawings. Shown are:

FIG. 1 a schematic illustration of a semiconductor component,

FIG. 2 a schematic illustration of a dopant profile, and

Figure 3:
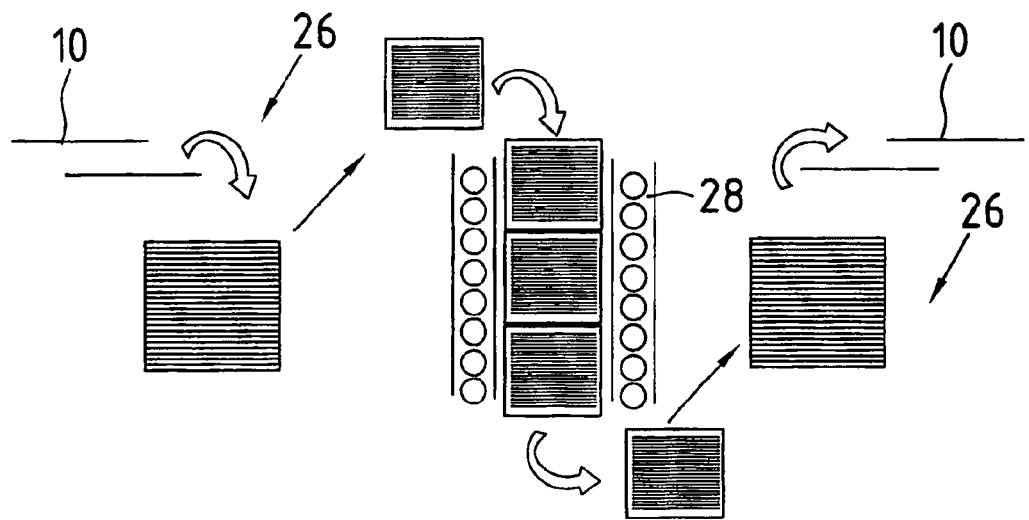

FIG. 3 a schematic illustration of a process sequence.

Illustrated on the basis of the figures, in a purely schematic manner, is the method in accordance with the invention for producing a dopant profile in a semiconductor component 10, in which the impinging electromagnetic radiation is transformed into electrical energy. The semiconductor component 10 in the exemplary embodiment has a p-conducting substrate 12, a back-side contact 14, front-side contacts 16, and an n-conducting emitter 18. Thereby formed is a pn transition, which generates an electric field in order to separate free charge carriers, which are produced by the impinging radiation, in order that they can reach the contacts 14, 16.

In the region of the back-side contact 14, furthermore, a layer 20, acting as a back surface field, can be formed. However, reference is made here to sufficiently known structures of semiconductor components for transforming light into electrical energy.

Conducted in accordance with the invention is a multistage manufacturing process for producing the emitter 18 in such a way that a dopant profile that is deeper than that for known corresponding semiconductor components is preferably produced. This is illustrated on the basis of FIG. 2 in a schematic manner. Here, the emitter depth is illustrated with respect to a dopant concentration for an emitter 18 to be produced, with, in the exemplary embodiment, the dopant atoms being phosphorus atoms. The curve 22 presents a phosphorus concentration, that is, a dopant profile, that characterizes conventional semiconductor components for transforming light radiation into electrical energy.

The dopant depth profile to be taken from curve 22 is achieved, in the case of conventional heat treatments of polycrystalline silicon carried out according to the prior art, for a heat treatment between 870° C. and 900° C. over a time period between 10 and 15 minutes, which includes heating and cooling.

Through the teaching of the invention, the penetration depth of the phosphorus atoms in the semiconductor substrate is increased and, as a result, effective penetration depths of 1.6 µm and more can exist. The corresponding concentration course, which can be achieved according to the method in accordance with the invention, is represented by curve 24 in FIG. 2. The deeper penetration takes place due to of a two-stage thermal method. In this process, in a first process step, a temporally provisional dopant profile is produced at process temperatures of between 500° C. and 1000° C., which has typical properties in the substrate layer near the surface. For production of the provisional dopant depth profile, a dopant source can be placed on the substrate surface. Alternatively, there is afforded the possibility, for example, by ion implantation or sputtering, of applying dopant atoms to the substrate or implanting them in the substrate. An example for the provisional or first dopant profile is identified by reference 23 in FIG. 2.

The thermal treatment for producing the provisional first dopant profile should take place in a temperature range between 500° C. and 920° C., provided that the substrate consists of polycrystalline silicon. In doing so, the semiconductor components are subjected to heat treatment individually, that is, separately, or at intervals from one another. The corresponding pretreated semiconductor components are then placed on top of one another in a stack 26, corresponding to FIG. 3, in order to be subsequently conveyed through a heat-treatment oven 28. In the exemplary embodiment, this takes place vertically, without the teaching in accordance with the invention being limited hereby. During the transport through the oven 28, the stack 26 and thus the semiconductor components 10 are held over a time period t with t from 10 to 20 min up to 24 h at a temperature T with T greater than 800° C. to below the melting point of the semiconductor material, in particular between 800° C. and 1000° C., with it being possible for an oxygen-deficient process atmosphere to prevail within the oven 28, in which in particular less than 100 ppm, preferably less than 10 ppm, oxygen can be present. The heating rate can be between 1 minute and 5 minutes. The cooling takes place at up to a temperature of about 500° C., preferably in an oven with a controlled process atmosphere. Subsequently, cooling can take place in air. The semiconductor components 10 are then separated.

A corresponding two-stage heat-treatment step then results in a dopant concentration that can be seen schematically in FIG. 2 and is characterized by the reference 24.

The curve 24 corresponds to a dopant concentration course in a polycrystalline semiconductor substrate made of silicon that has been subjected to a temperature of 900° C. over a time period of 4 hours.

On the basis of the teaching in accordance with the invention, there now exists the possibility of producing a so-called selective emitter 18, as can be seen schematically in FIG. 1. The selective emitter 18 has first and second regions 28, 30, which run at an offset relative to one another. Thus, the first regions 28 are shifted back relative to the second subregions. The first subregions 28 are produced by removing surface regions of the emitter 18, such as by etching them away or vaporizing them, with it being possible for the distance between the upper side of the second regions 30 and the upper sides of the first regions 28 to be, for example, 0.4 μm to 1.2 μm. This notwithstanding, the pn transition runs at a sufficient distance with respect to the surfaces of the first subregions 28. Furthermore, the emitter 18 has a sufficient conductivity, notwithstanding markedly lower surface concentration, as can be derived from FIG. 2 as well.

The removal of the surface regions of the emitter 18 to produce the first subregions 28 shows the advantage that impurities that have accumulated there are removed and accordingly the recombination rate is reduced. In contrast to this, the second subregions 30 have a high dopant concentration in their surfaces, so that a simple contacting with the material of the front contact 16 is possible.

In the surface of the first subregions 28, the dopant concentration should ideally be $5 \times 10^{18}$ to $10^{19}$ P atoms/cm$^3$.

Provided that solely a reduction of the waviness or a smoothing of the semiconductor components is to take place, or a reduction of crystal defects, such as dislocations, is to be achieved, without dopant profiles necessarily being produced, it is provided in accordance with the invention that semiconductor components in the stack are subjected to a heat treatment corresponding to the second, previously described heat-treatment step. However, the temperatures or holding times are adapted to the materials of the semiconductor components and the manufacture thereof. Thus, for example, it is provided that semiconductor components made of polycrystalline silicon and manufactured in particular according to the EFG method and arranged in a stack are heat-treated over a time $t_w$ with $2\,h \leq t_w \leq 4\,h$ at a temperature $T_w$ with, in particular, 850° C.$\leq T_w \leq$950° C. However, if the implantation of dopant atoms takes place only subsequent to this heat-treatment step, then very high process temperatures up to below the melting point of the semiconductor component are also conceivable in advantageous application. Then, however, adjusted cooling rates are chosen (for example, 5° K-50° K per hour).

The invention claimed is:

1. A method for producing a dopant profile starting from a surface of a chip- or wafer-shaped semiconductor component by introducing dopant atoms into the semiconductor component, comprising:
    producing a layer that contains at least one dopant on or in at least one region of the surface in the semiconductor component to produce a provisional first dopant profile, laying a plurality of semiconductor components having the layer on top of one another to form a stack, and
    subjecting the stack to a heat treatment in order to produce a second dopant profile having a greater depth in comparison to the first dopant profile in the respective semiconductor component,
    wherein the step of forming the oxide film layer is carried out at a temperature $T_1$ and the step of subjecting the stack to a heat treatment is carried out a temperature $T_2$ with $T_2$-100° C.$\leq T_1 \leq T_2$+100° C., and
    wherein the step of subjecting the stack to heat treatment comprises subjected the stack to the temperature $T_2$ over a holding time $t_h$ with 10 to 20 min$\leq t_h \leq$24 h.

2. The method according to claim 1, wherein the step of producing the layer comprises forming an oxide film layer containing dopant atoms.

3. The method according to claim 2, wherein prior to form the stack, each semiconductor component is heat-treated such that volatile constituents present in the oxide film layer are removed or substantially removed or converted or substantially converted.

4. The method according to claim 2, wherein the step of forming the oxide film layer comprises applying a liquid dopant source onto the semiconductor component.

5. The method according to claim 4, wherein the liquid dopant source is applied onto the semiconductor component by atomization, spraying, nebulization, vaporization with subsequent condensation, or by dipping methods.

6. The method according to claim 4, wherein the liquid dopant source is applied via a transfer device onto the semiconductor component.

7. The method according to claim 4, wherein the liquid dopant source comprises a material selected from the group consisting of a phosphorus-containing solution, a converted phosphoric acid solution, a phorphorus-containing solution, a phosphorus-containing paste, and any combinations thereof.

8. The method according to claim 4, where the liquid dopant source comprises a boron-containing solution, sol-gel solution, or paste.

9. The method according to claim 2, wherein, for a semiconductor component made of polycrystalline Si material, the step of forming the oxide film layer is carried out at a temperature $T_1$ with 500° C.$<T_1 \leq$920° C.

10. The method according to claim 1, wherein the substrate for the semiconductor component comprises silicon, polycrystalline silicon, or silicon manufactured according to the EFG method.

11. The method according to claim 1, wherein the step of forming the oxide film layer is carried out at a temperature $T_1$>500° C.

12. The method according to claim 1, wherein the step of producing the layer that contains at least one dopant comprises introducing or implanting the dopants on opposite-lying surfaces of the semiconductor components.

13. The method according to claim 1, further comprising subjecting the semiconductor substrate to heat treatment over a time period $t$ with 1 min$\leq t \leq$10 min.

14. The method according to claim 1, wherein the stack is heated from room temperature to the temperature $T_2$ in a time $t_A$ with 1 min$\leq t_A \leq$min.

15. The method according to claim 1, wherein, after production of the final or second dopant profile, the semiconductor components arranged in the stack are subjected to a temperature $T_3$ with 500° C.$\leq T_3 \leq$800° C.

16. The method according to claim 1, further comprising treating the semiconductor components arranged in the stack with forming gas.

17. A method for producing a dopant profile starting from a surface of a chip- or wafer-shaped semiconductor component by introducing dopant atoms into the semiconductor component, comprising:

produce a layer that contains at least one dopant on or in at least one region of the surface in the semiconductor component to produce a provisional first dopant profile, laying a plurality of semiconductor components having the layer on top of one another to form a stack, and subjecting the stack to a heat treatment in order to produce a second dopant profile having a greater depth in comparison to the first dopant profile in the respective semiconductor component, wherein the step of subjecting the stack to heat treatment is carried out in an oxygen-deficient process atmosphere containing less than 100 ppm oxygen.

18. A method for producing a dopant profile starting from a surface of a chip- or wafer-shaped semiconductor component by introducing dopant atoms into the semiconductor component, comprising:

producing a layer that contains at least one dopant on or in at least one region of the surface in the semiconductor component to produce a provisional first dopant profile, laying a plurality of semiconductor components having the layer on top of one another to form a stack, and subjecting the stack to a heat treatment in order to produce a second dopant profile having a greater depth in comparison to the first dopant profile in the respective semiconductor component, wherein the step of forming the oxide film layer is carried out at a temperature $T_1$ and the step of subjecting the stack to a heat treatment is carried out a temperature $T_2$ with $T_2-100°$ C.$\leq T_1 \leq T_2+100°$ C., and wherein the step of subjecting the stack to heat treatment comprises subjected the stack to the temperature $T_2$ over a holding time $t_h$ with 10 to 20 min$\leq t_h \leq$24 h.

19. A method for producing a dopant profile starting from a surface of a chip- or wafer-shaped semiconductor component by introducing dopant atoms into the semiconductor component, comprising:

producing a layer that contains at least one dopant on or in at least one region of the surface in the semiconductor component to produce a provisional first dopant profile, laying a plurality of semiconductor components having the layer on top of one another to form a stack, and subjecting the stack to a heat treatment in order to produce a second dopant profile having a greater depth in comparison to the first dopant profile in the respective semiconductor component, wherein the step of subjecting the stack to heat treatment is carried out in an oxygen-deficient process atmosphere containing less than 100 ppm oxygen.

* * * * *